United States Patent
Liao

(10) Patent No.: US 8,411,516 B2
(45) Date of Patent: Apr. 2, 2013

(54) MEMORY CELL HAVING REDUCED CIRCUIT AREA

(75) Inventor: Min-Nan Liao, Jhubei (TW)

(73) Assignee: Sitronix Technology Corp., Jhubei, Hsinchu County (TW)

( * ) Notice: Subject to any disclaimer, the term of this patent is extended or adjusted under 35 U.S.C. 154(b) by 218 days.

(21) Appl. No.: 13/044,258

(22) Filed: Mar. 9, 2011

(65) Prior Publication Data

US 2012/0008432 A1   Jan. 12, 2012

(30) Foreign Application Priority Data

Jul. 7, 2010 (TW) .............................. 99122283 A

(51) Int. Cl.
 *G11C 11/40* (2006.01)
(52) U.S. Cl. .................. 365/191; 365/72; 365/154
(58) Field of Classification Search .................. 365/174, 365/177
See application file for complete search history.

(56) References Cited

U.S. PATENT DOCUMENTS

| 6,366,493 B1 * | 4/2002 | Hsiao et al. | 365/156 |
| 6,724,650 B2 * | 4/2004 | Andoh | 365/156 |
| 6,853,579 B1 * | 2/2005 | Chou | 365/154 |

* cited by examiner

*Primary Examiner* — Tan T. Nguyen
(74) *Attorney, Agent, or Firm* — Muncy, Geissler, Olds & Lowe, PLLC

(57) ABSTRACT

The present invention relates to a memory cell having a reduced circuit area, which comprises a first transistor, a second transistor, a third transistor, and a fourth transistor. The first transistor is coupled to a readline and controlled by a wordline. The second transistor is coupled between the first transistor and a low-voltage power supply. The third transistor is coupled to the second transistor and controlled by a bitline. The third transistor controls turn-on and cutoff of the second transistor. Besides, the fourth transistor is coupled to the third transistor and a writeline, and is controlled by the wordline. Thereby, according to the present invention, four transistors form a memory cell, and the objective of saving circuit area can be achieved.

11 Claims, 15 Drawing Sheets

MEMORY CELL HAVING REDUCED CIRCUIT AREA

FIELD OF THE INVENTION

The present invention relates generally to a memory cell, and particularly to a memory cell having a reduced circuit area.

BACKGROUND OF THE INVENTION

With the development of multi-core system-on-a-chip (SoC), more memories are integrated thereon for facilitating operations of each core. Thereby, memories will definitely occupy the greater part of the chip area in the future, and become a significant factor influencing the performance of the SoC as well as consuming a considerable quantity of power. Accordingly, how to reduce the area and power consumption of memories effectively has become an important subject. FIG. 1 shows a circuit diagram of a memory cell according to prior art. As shown in the figure, the memory cell according to the prior art comprises a first inverter 10', a second inverter 20', and an access port 30'. The input of the first inverter 10' is coupled to the output of the second inverter 20'; while the output of the first inverter 10' is coupled to the input of the second inverter 20'. Besides, the access port 30' is coupled to the second inverter 20' and a bitline (BL), and is coupled to a wordline (WL) as well. The access port 30' is an N-type metal-oxide-semiconductor field-effect transistor (NMOS). Thereby, when the bitline is high level, the access port 30' is turned on, causing a threshold voltage across the access port 30', and hence reducing the effective voltage applied to the memory cell by the bitline. Moreover, FIG. 2 shows a circuit diagram of another memory cell according to prior art. As shown in the figure, the access port 30' is replaced by a P-type metal-oxide-semiconductor field-effect transistor (PMOS). Thereby, when the bitline is high level and hence turning on the access port 30', the voltage of the bitline can be transferred to the storage device without loss.

Generally speaking, when a single-ended memory cell reads or writes a logic "1", the bitline will be firstly be maintained at a high level and the wordline will be turned on. Thereby, the single-ended memory cell cannot know how the bitline and wordline act and whether a logic "1" is being read or written. Hence, a memory cell is designed for writing or reading data in accordance with various levels of the bitline. When the memory cell reads, the voltage level of the bitline has to be changed to a relatively lower voltage level, so that data stored in the first inverter 10' and the second inverter 20' can be read via the access port 30'. When the memory cell writes, the bitline has to be changed to a high voltage level, so that data can be written to the memory cell composed by the first inverter 10' and the second inverter 20'.

FIG. 3 shows a circuit diagram of another memory cell according to prior art. As shown in the figure, the memory cell 40' according to the prior art comprises a first transistor 42', a third inverter 44', a second transistor 46', and a fourth inverter 48'. A terminal of the first transistor 42' is coupled to a dataline D' and controlled by a wordline W. The input of the third inverter 44' is coupled to the other terminal of the first transistor 42'. A terminal of the second transistor 46' is coupled to the output of the third inverter 44' and controlled by the wordline W. The input of the fourth inverter 48' is coupled to the other terminal of the second transistor 46' and the output of the third inverter 44'. The output of the fourth inverter 48' is coupled to the first transistor 42' and the input of the third inverter 44'. The third inverter 44' includes a third transistor 440' and a fourth transistor 442'; the fourth inverter 48' includes a fifth transistor 480' and a sixth transistor 482'. Because the inverter structure is a well known by a person having ordinary skill in the art, it is not described in more details here.

When the memory cell 40' in FIG. 3 is not writing data, the signals in the wordline W are low-level signals, making the first and second transistors 42', 44' turned off (cutoff). At this moment, because the third inverter 44' and the fourth inverter 48' are cross-coupled, the data at the N1 node of the third inverter 44' and the data at the N2 node of the fourth inverter 48' are inversely latched to each other. When the memory cell 40' writes, namely, when the memory cell 40' writes "1", the signal in the wordline W is high level (that is, "1", and hence the first and second transistors 42', 46' are turned on, the signal in the dataline D is "1", and the signal in the bitline DB is "0". After the memory cell 40' finishes writing data, the signal in the wordline W is changed to low level, turning off the first and second transistors 42', 44', and thereby latching the data.

With the progress of technological products, memory cells are demanded increasingly. In addition, the competition pressure on price and capacity increases as well. Thereby, memory cells with smaller unit area become more important, which means that a memory cell having fewer transistors is one of the objectives to work for.

Accordingly, the present invention provides a novel memory cell having a reduced circuit area, which uses fewer transistors to form a memory cell. Thereby, the problems described above can be solved.

SUMMARY

An objective of the present invention is to provide a memory cell having a reduced circuit area, which uses four transistors to form a memory cell, and hence the objective of saving circuit area can be achieved.

The memory cell according to the present invention comprises a first transistor, a second transistor, a third transistor, and a fourth transistor. The first transistor is coupled to a readline and controlled by a wordline. The second transistor is coupled between the first transistor and a low-voltage power supply. The third transistor is coupled to the second transistor and controlled by a bitline. The third transistor controls turn-on and cutoff of the second transistor. Besides, the fourth transistor is coupled to the third transistor and a writeline, and is controlled by the wordline. Thereby, according to the present invention, four transistors form a memory cell, and the objective of saving circuit area can be achieved.

DETAILED DESCRIPTION

In order to make the structure and characteristics as well as the effectiveness of the present invention to be further understood and recognized, the detailed description of the present invention is provided as follows along with embodiments and accompanying figures.

Figure 4:
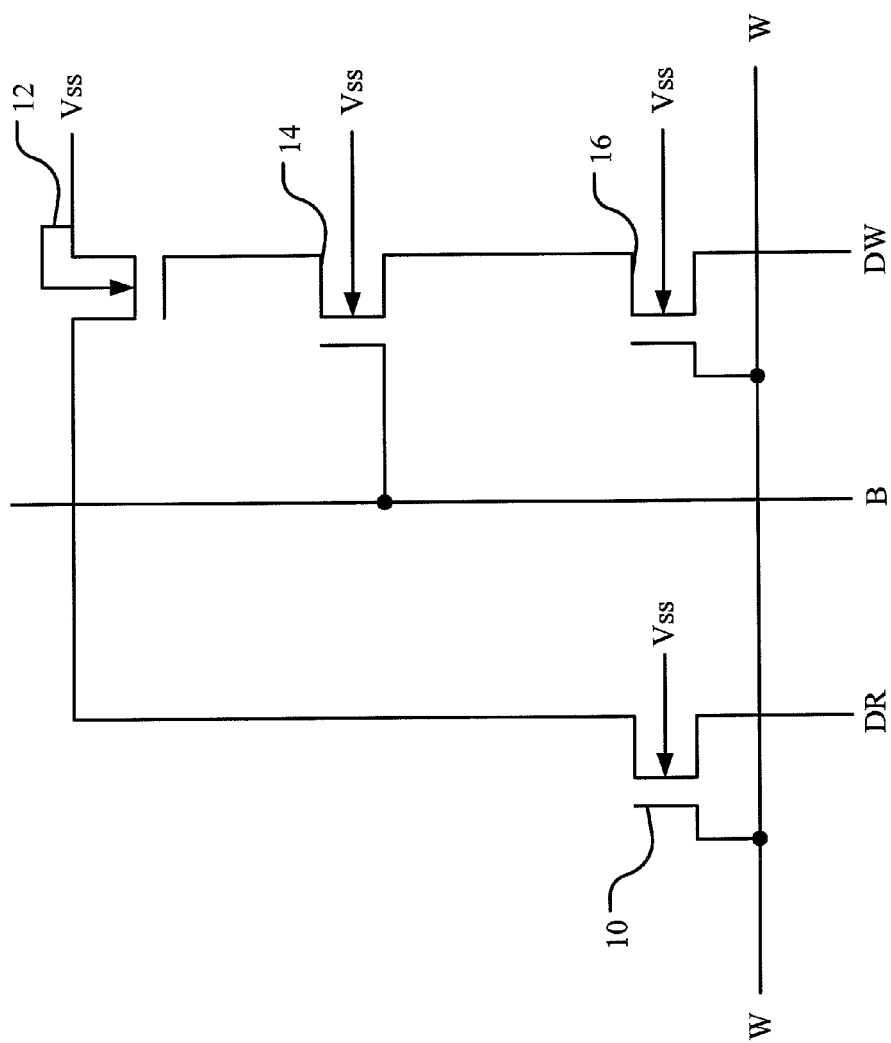
FIG. 4 shows a circuit diagram of a memory cell according to a preferred embodiment of the present invention.

FIG. 4 shows a circuit diagram of a memory cell according to a preferred embodiment of the present invention. As shown in the figure, the memory cell 1 according to the present invention comprises a first transistor 10, a second transistor 12, a third transistor 14, and a fourth transistor 16. The first transistor 10 is coupled to a readline DR and controlled by a wordline W. The second transistor 12 is coupled between the first transistor 10 and a low-voltage power supply VSS. The third transistor 14 is coupled to the second transistor 12 and controlled by a bitline B. The third transistor 14 controls turn-on and cutoff of the second transistor 12. Besides, the fourth transistor 16 is coupled to the third transistor 14 and a writeline DW, and is controlled by the wordline W. Thereby, according to the present invention, four transistors form the memory cell 1, and the objective of saving circuit area can be achieved. The first, second, third, and fourth transistors 10, 12, 14, 16 are NMOS. In the following, how the memory cell 1 reads or writes data will be described in detail.

Besides, the memory cell 1 having a reduced circuit area according to the present invention further comprises a control circuit 20, which is coupled to the wordline W, the bitline B, the readline DR, and the writeline DW for controlling the memory cell 1 to write or read data. In the following, how the control circuit 20 controls the memory cell 1 to write or read data will be described in detail.

Figure 5A:
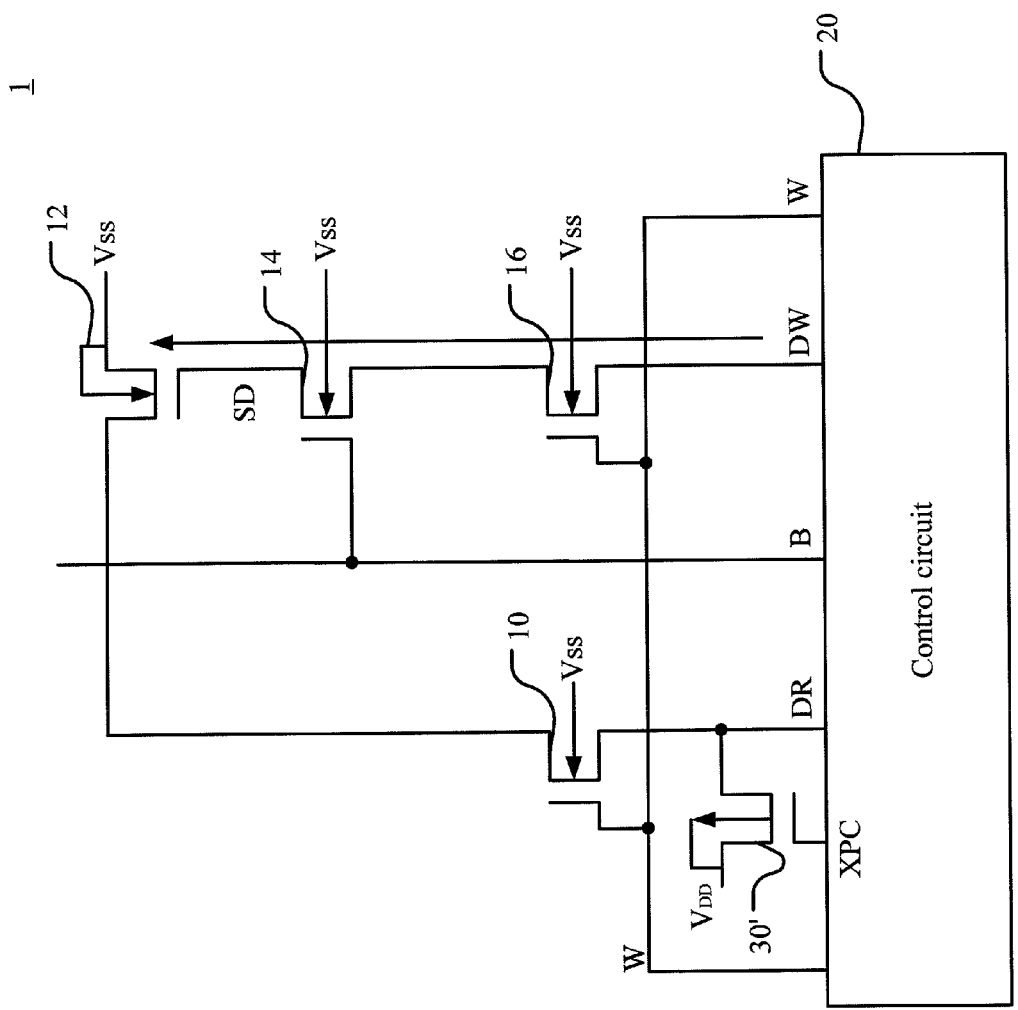
FIG. 5A shows a schematic diagram of a memory cell writing data according to a preferred embodiment of the present invention.
Figure 5B:
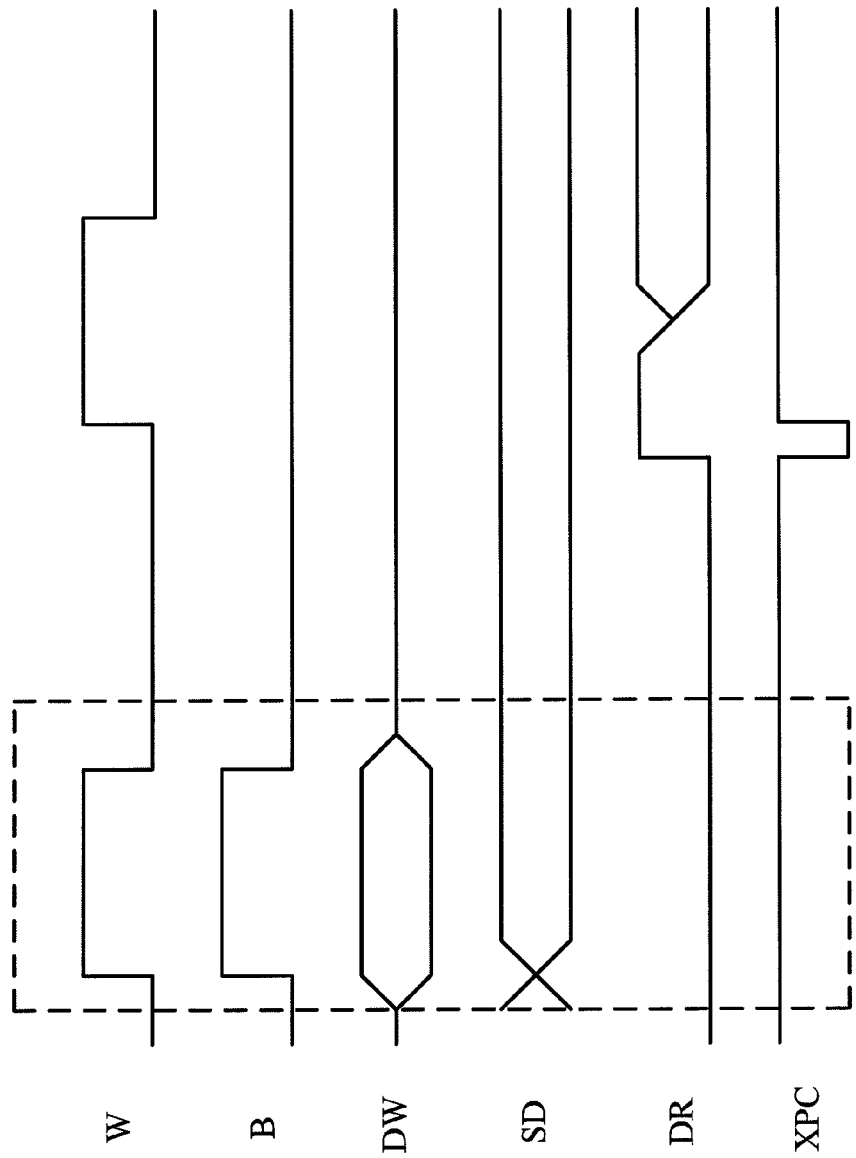
FIG. 5B shows timing diagrams of FIG. 5A according to a preferred embodiment of the present invention.

FIG. 5A and FIG. 5B show a schematic diagram of a memory cell writing data and its corresponding timing diagrams according to a preferred embodiment of the present invention. As shown in the figures, when the memory cell 1 writes data, the control circuit 20 turns on the wordline W and the bitline B to make signals in the wordline W and the bitline B high-level signals, which, in turn, turns the first, the third, and the fourth transistors 10, 14, 16. At this time, the control circuit 20 transmits storage data to the storage node SD between the second and third transistors 12, 14 via the writeline DW and thus completing data storage.

Figure 6A:
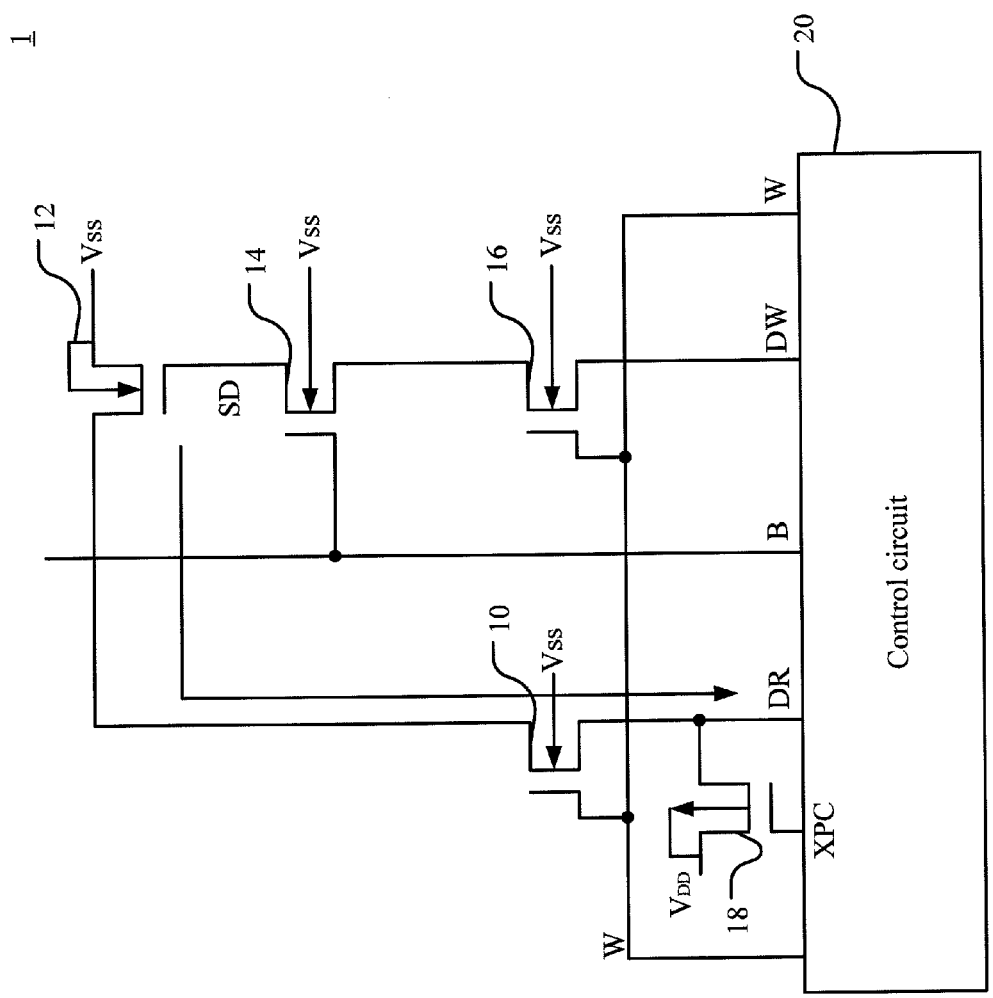
FIG. 6A shows a schematic diagram of a memory cell reading data according to another preferred embodiment of the present invention.
Figure 6B:
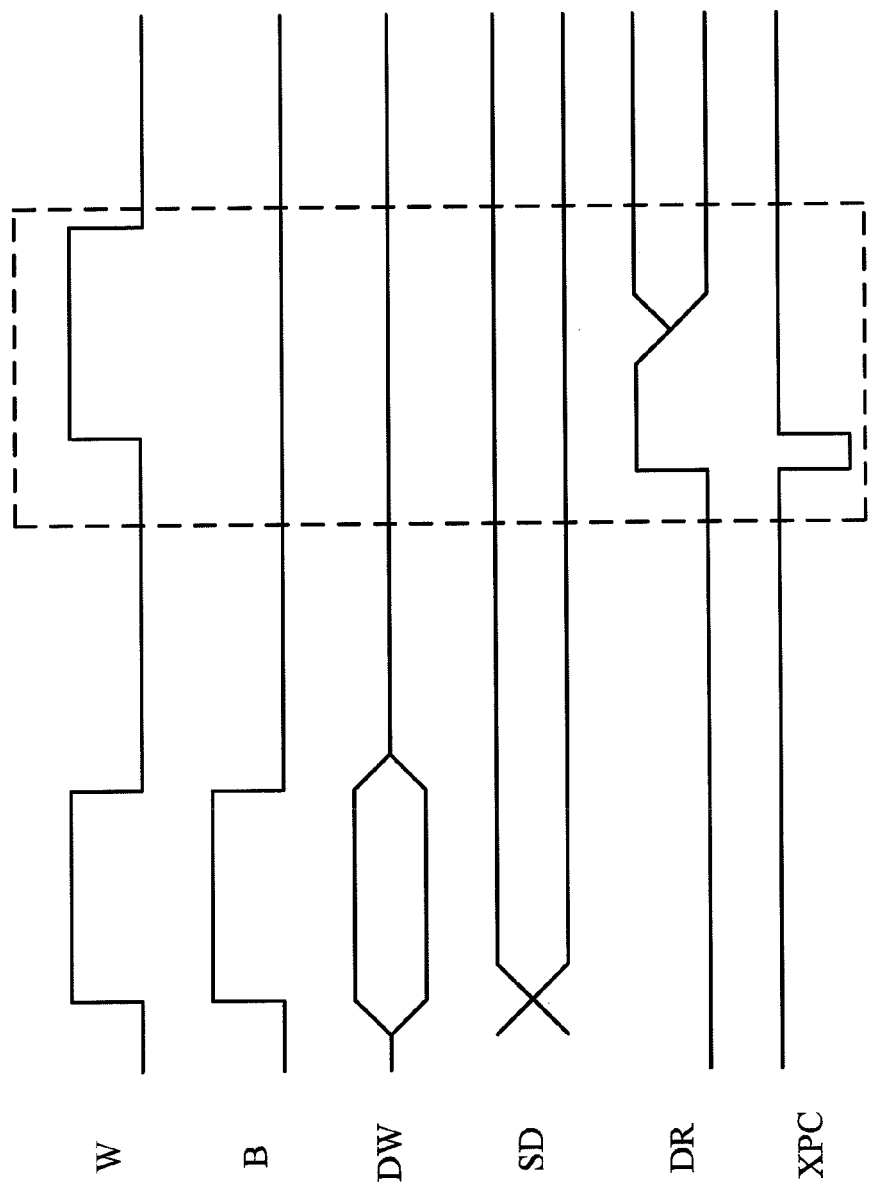
FIG. 6B shows timing diagrams of FIG. 6A according to a preferred embodiment of the present invention.

FIG. 6A and FIG. 6B show a schematic diagram of a memory cell writing data and its corresponding timing diagrams according to another preferred embodiment of the present invention. As shown in the figures, the memory cell 1 having a reduced circuit area further comprises a fifth transistor 18. The fifth transistor 18 is coupled to the readline DR and a power supply VDD, and is controlled by a read signal XPC. According to the present embodiment, the fifth transistor 18 is a PMOS. Of course, it can also be an NMOS with an opposite control method, which is well known to a person having ordinary skill in the art and thereby will not be described in more details. When the memory cell 1 reads data, the control circuit 20 transmits the read signal XPC to the fifth transistor 18 to turn on the fifth transistor 18 and to make the signal in the readline DR the high-level signal (namely, the digital signal "1"). In other words, the control circuit 20 produces the read signal XPC having the low-level signal and transmits it to the fifth transistor 18 for turning it on. Once the fifth transistor 18 is turned on, the power supply VDD will provide the high-level signal and the high-level signal will be transmitted to the readline DR. After the signal in the readline DR is changed to the high-level signal (namely, the digital signal "1"), the control circuit 20 turns on the wordline W, which means changing the signal in the wordline to the high-level signal, but not turning on the bitline B. At this time, the signal at the storage node SD (namely, the data stored in the memory cell 1) is transferred to the control circuit via the second transistor 12 and the first transistor 10, and thus completing data reading.

When the stored data at the storage node SD is the digital signal "1", the signal at the read node DR is changed to a low-level signal (namely, the digital signal "0"). On the contrary, when the stored data at the storage node SD is the digital signal "0", the signal at the read node DR is maintained to a high-level signal (namely, the digital signal "1"). Thereby, the memory cell 1 according to the present invention can read the stored data at the storage node SD.

Figure 7A:
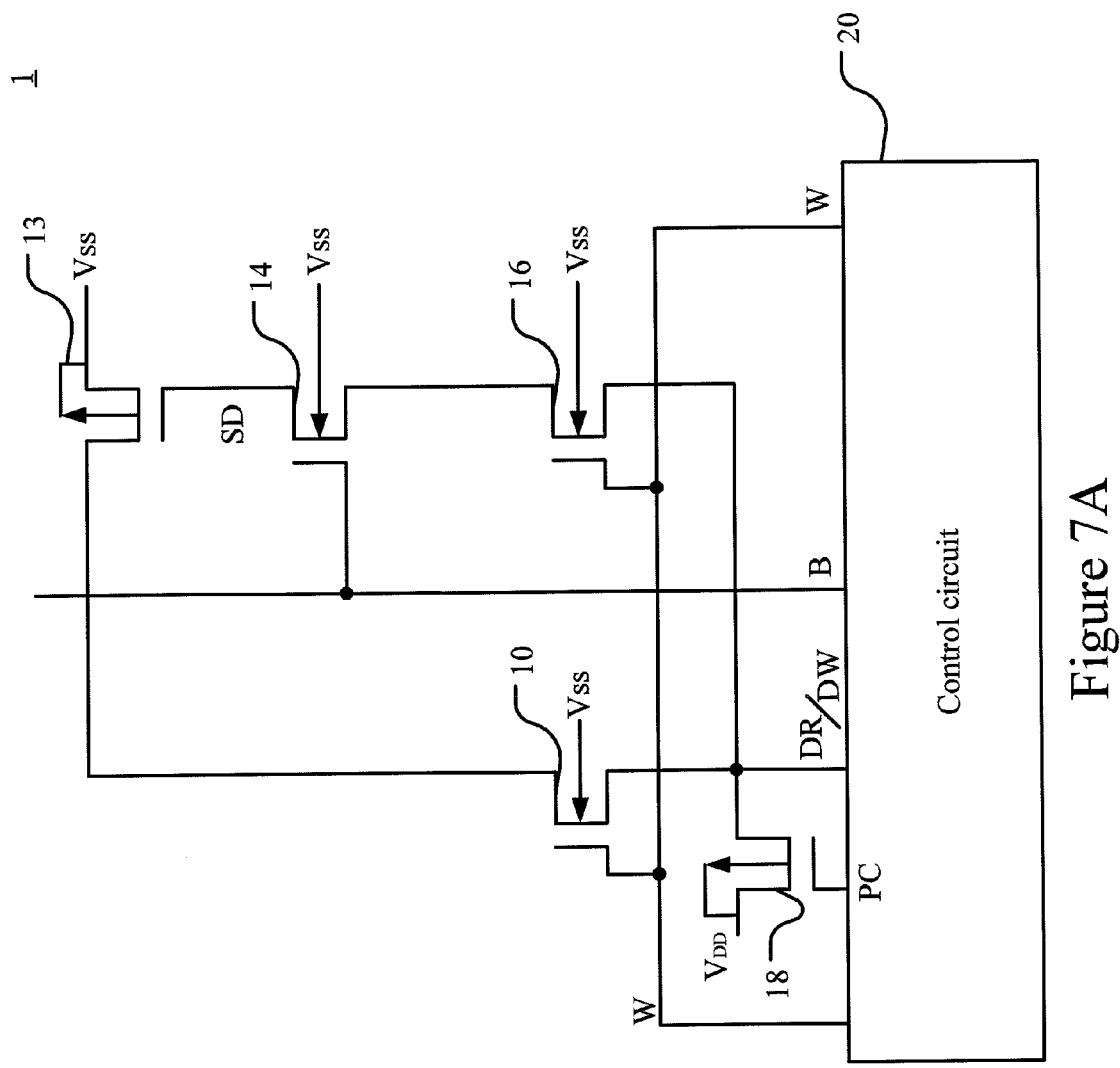
FIG. 7A shows a circuit diagram of a memory cell according to another preferred embodiment of the present invention.
Figure 7B:
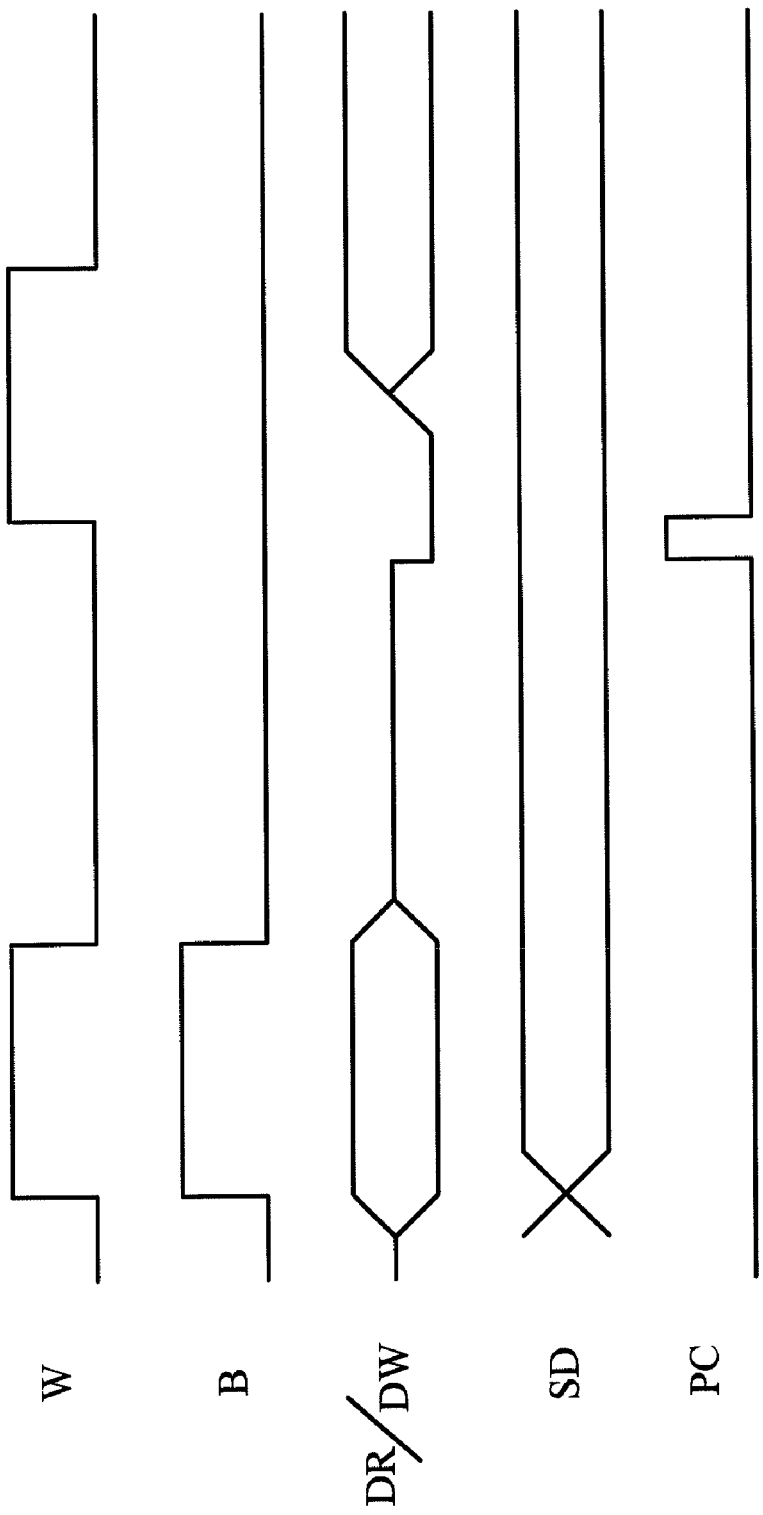
FIG. 7B shows timing diagrams of FIG. 7A according to a preferred embodiment of the present invention.

FIG. 7A and FIG. 7B show a circuit diagram and timing diagrams of a memory cell according to another preferred embodiment of the present invention. As shown in the figures, the difference between the present embodiment and the one in FIG. 4 is that the control circuit 20 according to the present embodiment comprises a read/write node DR/DW, which integrates the read node DR and the write node DW for reducing pin count of the control circuit 20, and hence, in turn, saving the area of the control circuit 20 and saving cost. In addition, a sixth transistor 13 according to the present embodiment replaces the second transistor 12, and the sixth transistor 13 is a PMOS. According to the present embodiment, how the memory cell 1 reads and writes data is shown in FIG. 7B, which is similar to FIGS. 5B and 6B. A person having ordinary skill in the art can easily understand the timing diagrams shown in FIG. 7B according to those shown in FIGS. 5B and 6B. Thereby, the timing diagrams shown in FIG. 7B will not be described in more details.

Figure 8:
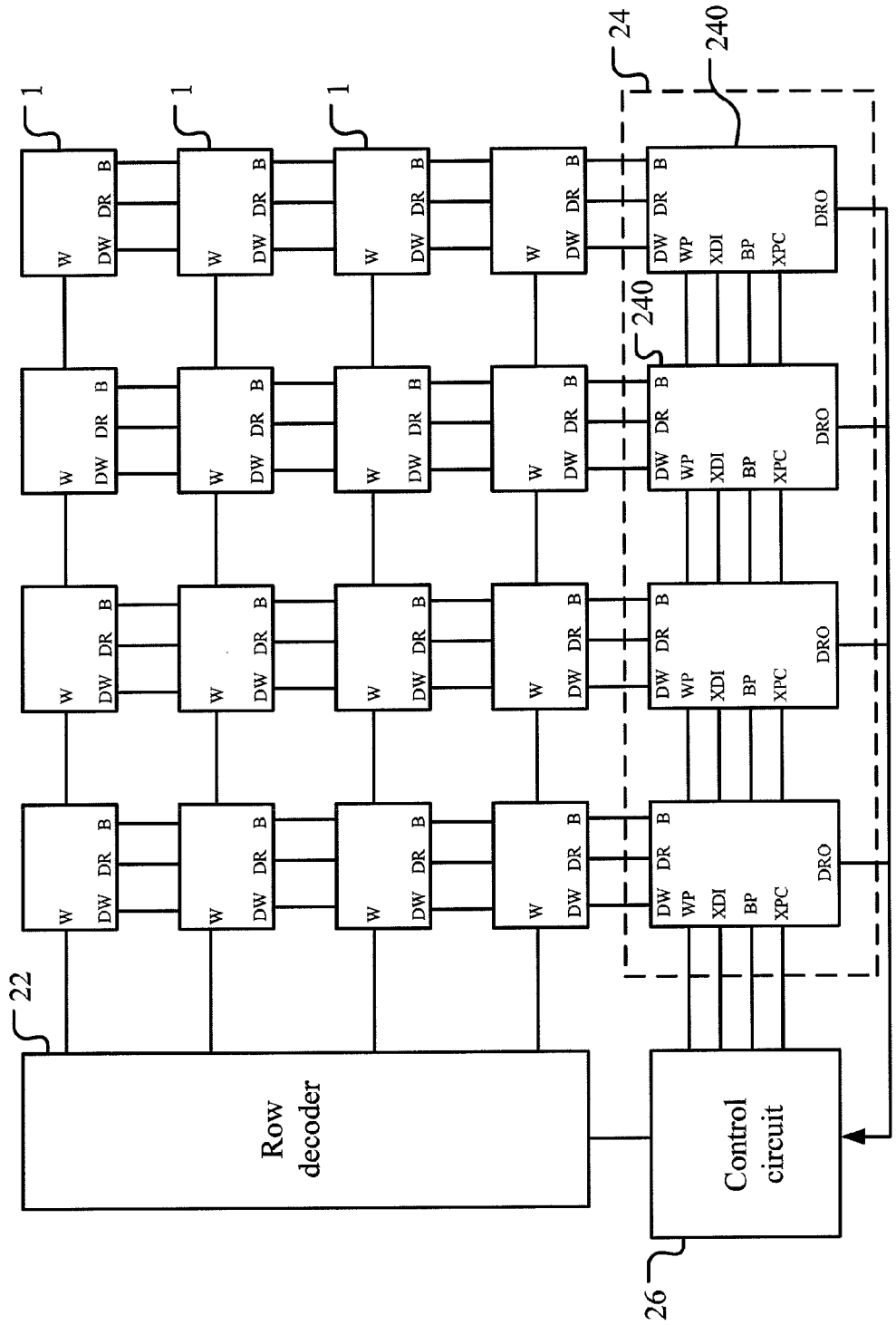
FIG. 8 shows a circuit diagram of a memory cell array according to a preferred embodiment of the present invention.

FIG. 8 shows a circuit diagram of a memory cell array according to a preferred embodiment of the present invention. As shown in the figure, the control circuit 20 of the memory cell 1 having a reduced circuit area according to the present invention includes a row decoder 22, a column decoder 24, and a control unit 26. According to the present embodiment, a plurality of memory cells are adopted. The row decoder 22 is coupled to the wordlines W for controlling turn-on/cutoff of the plurality of memory cells 1. In other word, the row decoder 22 is coupled to the wordlines W of the plurality of memory cells 1 for controlling turn-on/cutoff of the memory cells 1 by means of controlling turn-on/cutoff of the wordlines W. The column decoder 24 is coupled to the bitlines B, readlines DR, and writelines DW for controlling their turn-on/cutoff in accordance with turn-on/cutoff of the wordlines W, and thus controlling the memory cells 1 to write or read data. The control unit 26 is coupled to the row decoder 22 and the column decoder 24 for controlling the memory cells 1 to write or read data.

Moreover, the control signal produced by the control unit 26 according to the present embodiment includes a write signal WP, write data XDI, a read signal XPC, read data DRO, and a bitline control signal BP. When the memory cell 1 writes data, the control unit 26 firstly produces and transmits the write signal WP to a plurality of column-decoding units 240 of the column decoder 24. Then the control unit 26 transmits the write data XDI to the plurality of memory cells 1 via the plurality of column decoding units 240. When the memory cell 1 reads data, the control unit 26 firstly produces and transmits the read signal XPC to the plurality of column decoding units 240 of the column decoder 24. Then the plurality of column decoding units 240 read the read data DRO of the plurality of memory cells 1 according to the read signal XPC, and return the read data DRO to the control unit 26. The control unit 26 produces and transmits the bitline control signal BP to the plurality of column decoding units 240 of the column decoder 24 for controlling turn-on/cutoff of the bitline B of the plurality of memory cells 1.

Figure 1:
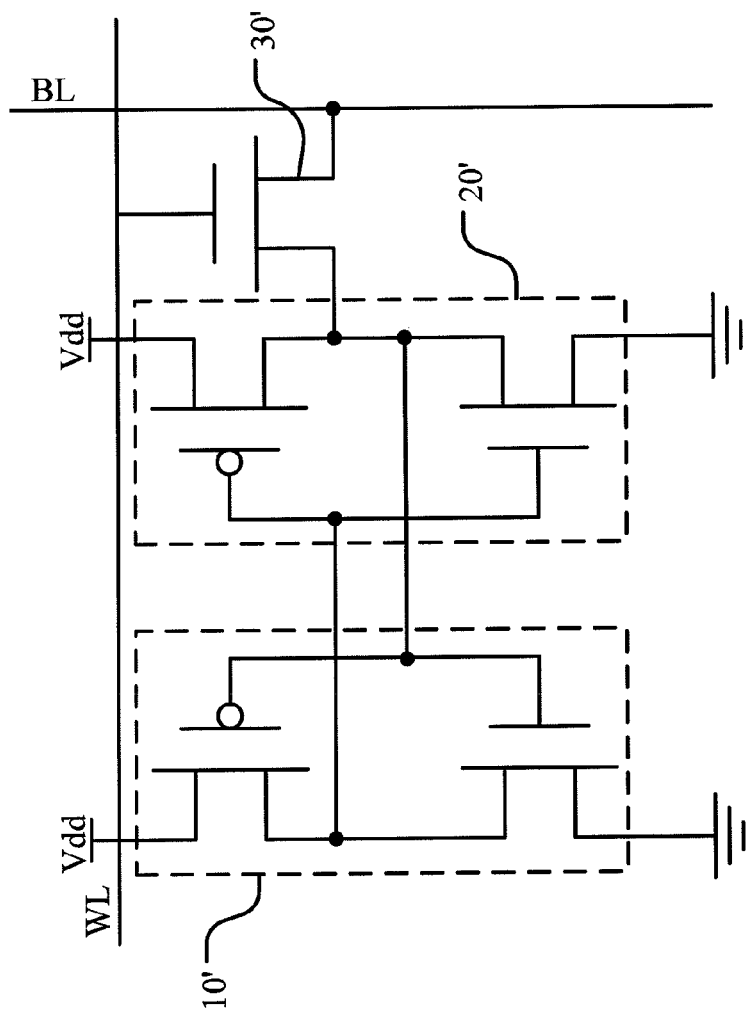
FIG. 1 shows a circuit diagram of a memory cell according to prior art.
Figure 2:
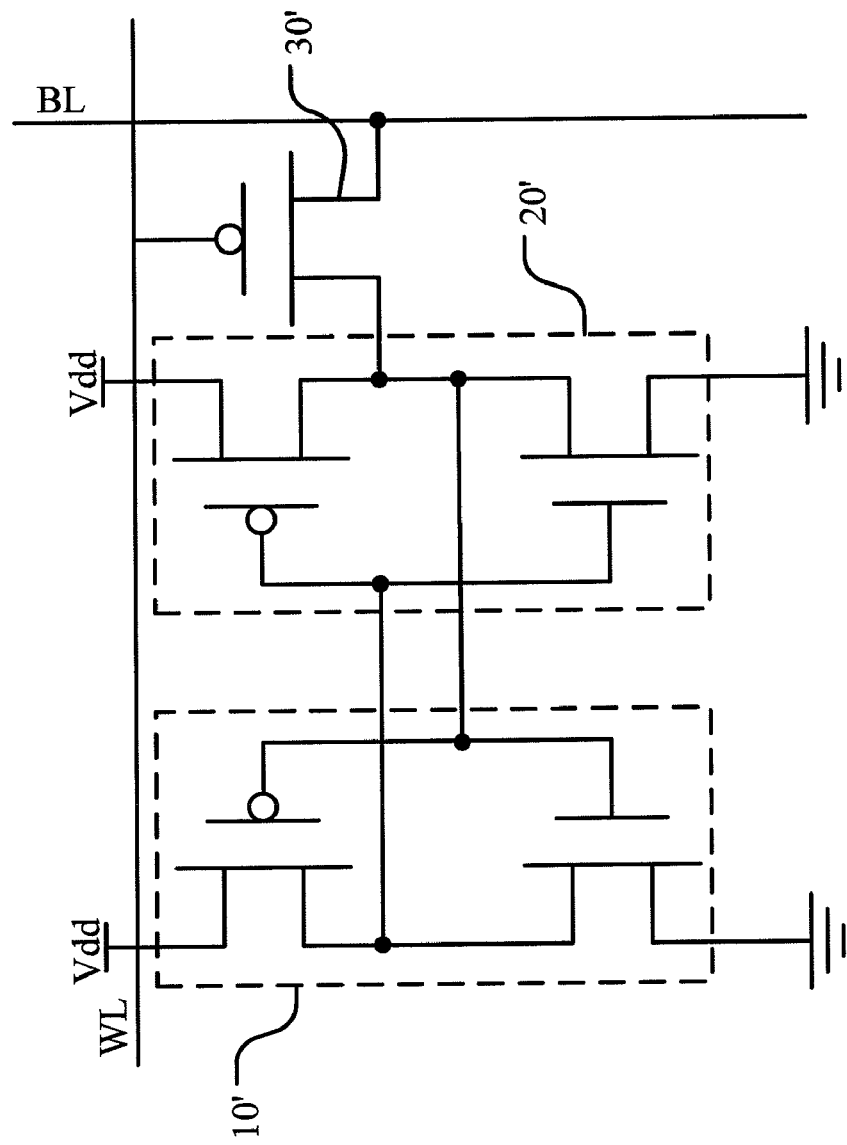
FIG. 2 shows a circuit diagram of another memory cell according to prior art.
Figure 3:
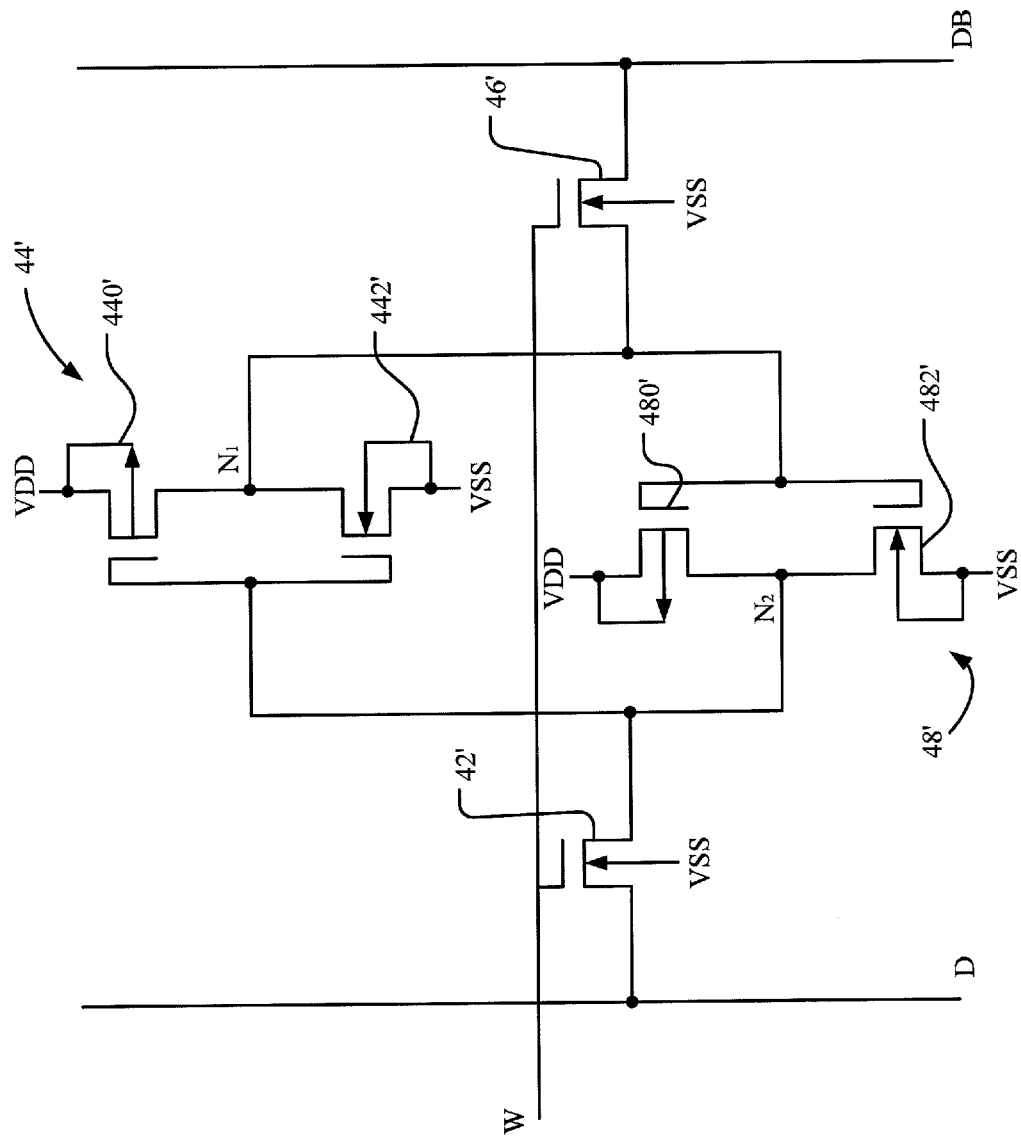
FIG. 3 shows a circuit diagram of another memory cell according to prior art.
Figure 9A:
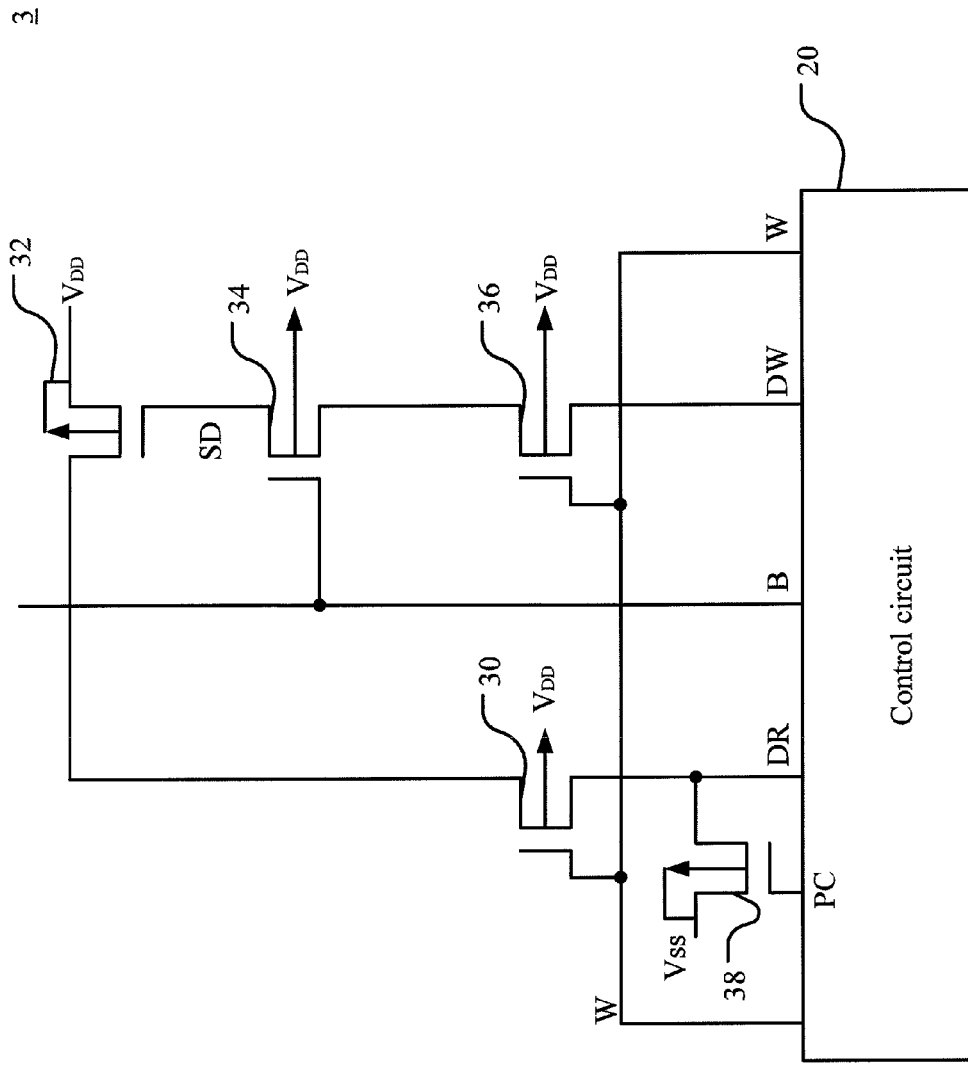
FIG. 9A shows a circuit diagram of a memory cell according to another preferred embodiment of the present invention.
Figure 9B:
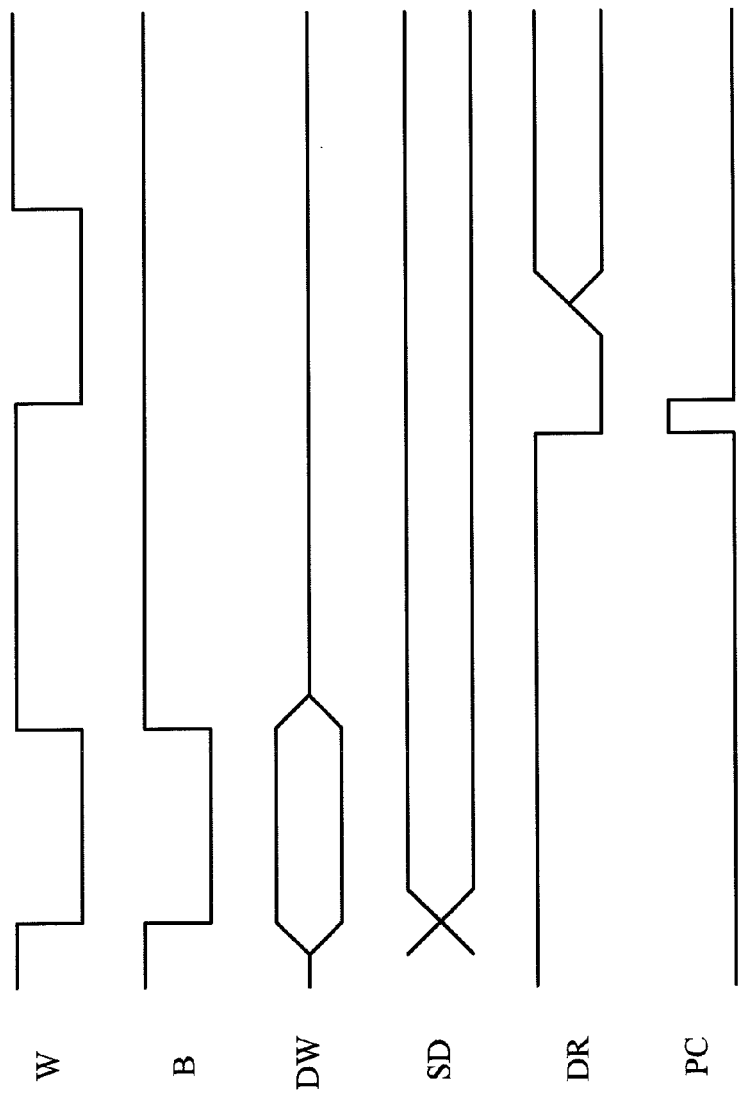
FIG. 9B shows timing diagrams of FIG. 9A according to a preferred embodiment of the present invention.

FIG. 9A and FIG. 9B show a circuit diagram and timing diagrams of a memory cell according to another preferred embodiment of the present invention. As shown in the figures, the difference between the present embodiment and the one in FIG. 3 is that a seventh transistor 30, a eighth transistor 32, a ninth transistor 34 and a tenth transistor 36 according to the present embodiment are PMOS. The method of controlling the seventh, eighth, ninth, and tenth 30, 32, 34, 36 for reading or writing data from/to the memory cell 3 is opposite to the method in FIG. 4B and FIG. 5B. However, the control methods are approximately the same, and hence will not be described in details here. Furthermore, the present embodiment includes a eleventh transistor 38, which is used for controlling the memory cell 3 to read data, and can be a PMOS or an NMOS.

Figure 10A:
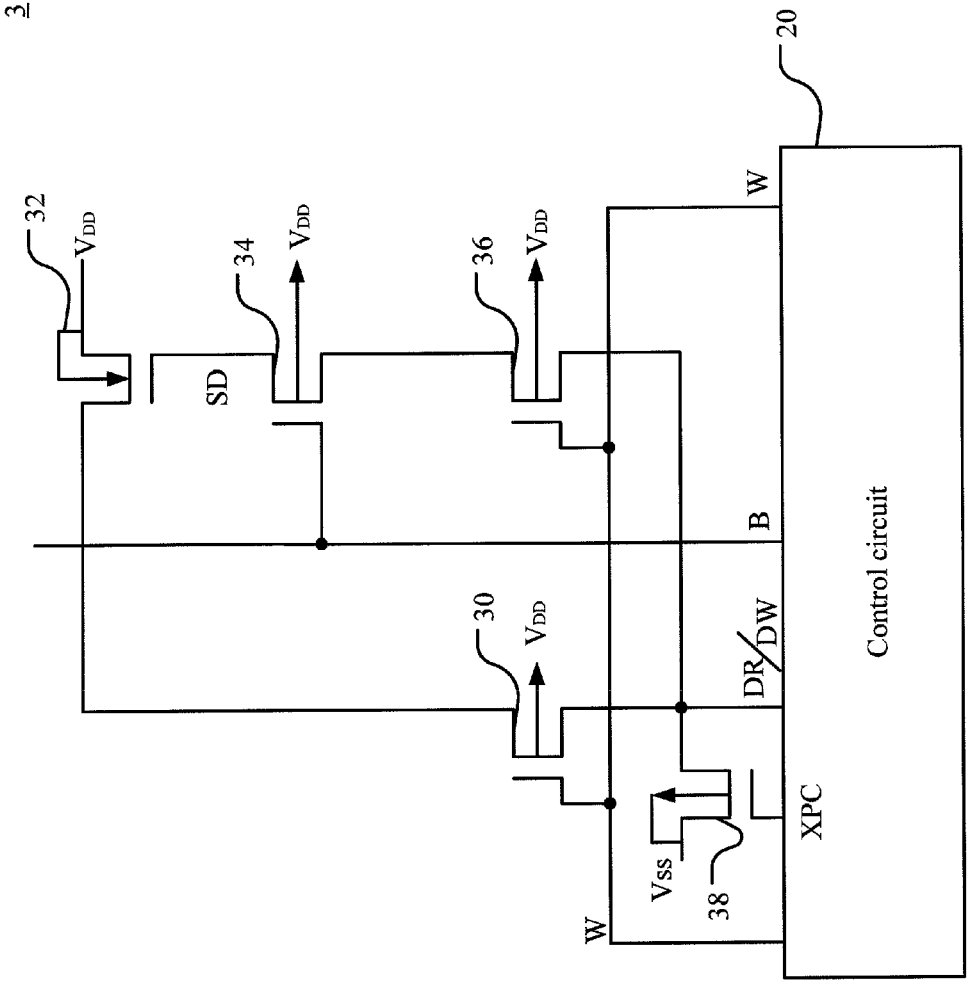
FIG. 10A shows a circuit diagram of a memory cell according to another preferred embodiment of the present invention.
Figure 10B:
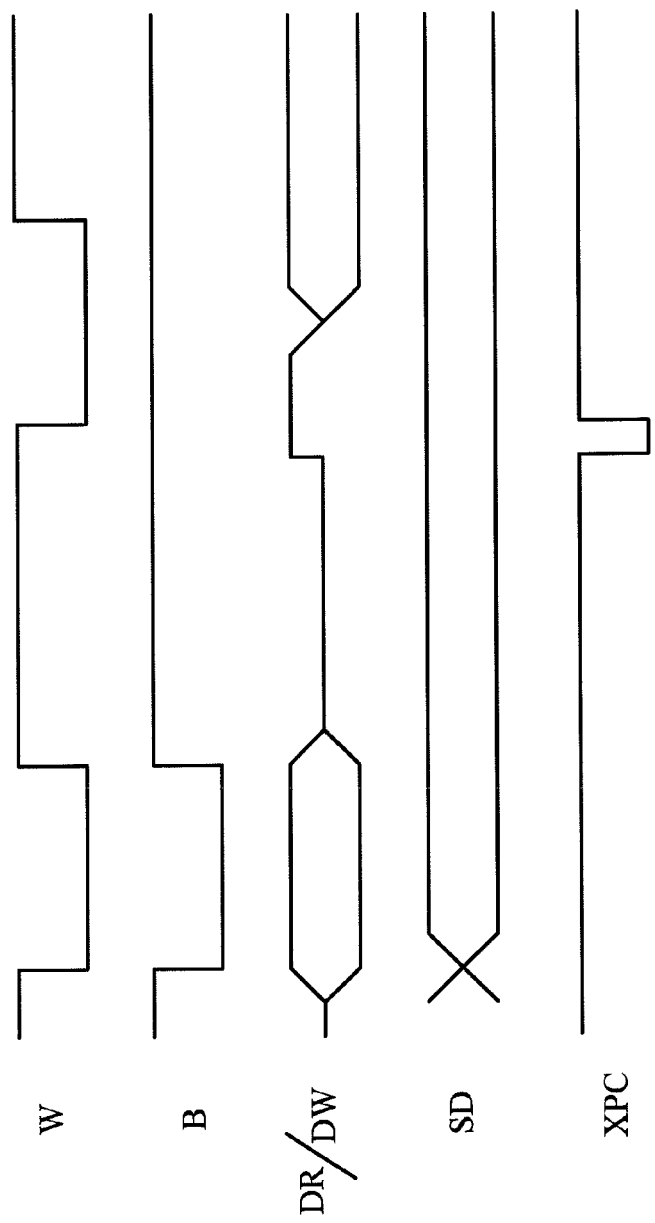
FIG. 10B shows timing diagrams of FIG. 10A according to a preferred embodiment of the present invention.

FIG. 10A and FIG. 10B show a circuit diagram and timing diagrams of a memory cell according to another preferred embodiment of the present invention. As shown in the figures, the difference between the present embodiment and the one in FIG. 9A is that the control circuit 20 according to the present embodiment comprises a read/write node DR/DW, which integrates the read node DR and the write node DW for reducing pin count of the control circuit 20, and hence, in turn, saving the area of the control circuit 20 and saving cost. In addition, a twelfth transistor 33 according to the present embodiment replaces the eighth transistor 32, and the twelfth transistor 33 is an NMOS. According to the present embodiment, how the memory cell 3 reads and writes data is shown in FIG. 09B, which is similar to FIG. 9B. A person having ordinary skill in the art can easily understand the timing diagrams shown in FIG. 10B according to those shown in FIG. 9B. Thereby, the timing diagrams shown in FIG. 10B will not be described in more details.

To sum up, the memory cell according to the present invention comprises a first transistor, a second transistor, a third transistor, and a fourth transistor. The first transistor is coupled to a readline and controlled by a wordline. The second transistor is coupled between the first transistor and a low-voltage power supply. The third transistor is coupled to the second transistor and controlled by a bitline. The third transistor controls turn-on and cutoff of the second transistor. Besides, the fourth transistor is coupled to the third transistor and a writeline, and is controlled by the wordline. Thereby, according to the present invention, four transistors form a memory cell, and the objective of saving circuit area can be achieved.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A memory cell having a reduced circuit area, comprising:
    a first transistor, coupled to a readline, and controlled by a wordline;
    a second transistor, coupled between said first transistor and a low-voltage power supply;
    a third transistor, coupled to said second transistor, or controlled by a bitline or controlling turn-on/cutoff of said second transistor; and
    a fourth transistor, coupled to said third transistor and a writeline, and controlled by said wordline.

2. The memory cell of claim 1, and further comprising a fifth transistor, coupled to said readline and a power supply, and controlled by a read signal.

3. The memory cell of claim 2, wherein said fifth transistor is a P-type field-effect transistor.

4. The memory cell of claim 1, and further comprising a fifth transistor, coupled to said readline and a low-voltage power supply, and controlled by said a read signal.

5. The memory cell of claim 4, wherein said fifth transistor is an N-type field-effect transistor.

6. The memory cell of claim 1, wherein said wordline and said bitline turn on said first transistor, third transistor, and fourth transistor for writing data between said second transistor and said third transistor.

7. The memory cell of claim 1, wherein said wordline turns on said first transistor for reading data stored between said second transistor and said third transistor.

8. The memory cell of claim 1, wherein said memory cell is coupled to a control circuit coupled to said wordline, said bitline, said readline, and said writeline for controlling said memory cell to write or read data.

9. The memory cell of claim 8, wherein said control circuit comprises:
    a row decoder, coupled to said wordline for controlling turn-on/cutoff of said memory cell;
    a column decoder, coupled to said bitline, said readline, and said writeline; and
    a control unit, coupled to said row decoder and said column decoder, producing a control signal, and transmitting said control signal to said row decoder and said column decoder for controlling said memory cell to read or write data.

10. The memory cell of claim 1, wherein said first transistor, said second transistor, said third transistor, and said fourth transistor are N-type filed-effect transistors.

11. The memory cell of claim 10, wherein said substrates of said first transistor, said second transistor, said third transistor, and said fourth transistor are coupled to said low-voltage power supply.

* * * * *